(12) United States Patent
Lu et al.

(10) Patent No.: US 11,329,251 B2
(45) Date of Patent: May 10, 2022

(54) ORGANIC FILM STRUCTURE AND PREPARATION METHOD THEREOF, ENCAPSULATION STRUCTURE AND PREPARATION METHOD THEREOF, AND LIGHT-EMITTING SUBSTRATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Guanyu Lu, Beijing (CN); Haiping Zhao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 578 days.

(21) Appl. No.: 16/332,548

(22) PCT Filed: Sep. 13, 2018

(86) PCT No.: PCT/CN2018/105510
§ 371 (c)(1),
(2) Date: Mar. 12, 2019

(87) PCT Pub. No.: WO2019/214123
PCT Pub. Date: Nov. 14, 2019

(65) Prior Publication Data
US 2021/0376289 A1     Dec. 2, 2021

(30) Foreign Application Priority Data
May 11, 2018   (CN) .......................... 201810450058.4

(51) Int. Cl.
*H01L 51/52*   (2006.01)
*H01L 51/56*   (2006.01)

(52) U.S. Cl.
CPC .......... *H01L 51/5253* (2013.01); *H01L 51/56* (2013.01)

(58) Field of Classification Search
CPC ....... H01L 51/5253–5256; H01L 51/524–525; H01L 51/56
See application file for complete search history.

(56) References Cited

U.S. PATENT DOCUMENTS 9,685,626 B2   6/2017   Kim
2003/0170496 A1*   9/2003   Hieda ................. H01L 51/5259
428/690

(Continued)

FOREIGN PATENT DOCUMENTS

CN   104900681 A   9/2015
CN   105283317 A   1/2016

(Continued)

OTHER PUBLICATIONS

Office Action dated Dec. 16, 2019, issued in counterpart CN application No. 201810450058.4, with English translation. (11 pages).

(Continued)

*Primary Examiner* — Shaun M Campbell
(74) *Attorney, Agent, or Firm* — WHDA, LLP

(57) ABSTRACT

The present disclosure relates to a method for preparing an organic film structure. The method for preparing the organic film structure may include forming a pigment mixture layer outside a region where an organic film is to be formed using a pigment liquid mixture, forming a liquid organic layer in the region where the organic film is to be formed with a first liquid organic material, and curing the pigment mixture (Continued)

layer and the liquid organic layer to form an indicator film and the organic film, respectively. The pigment mixture layer may include a pigment.

18 Claims, 7 Drawing Sheets

(56) References Cited

U.S. PATENT DOCUMENTS

| | | |
|---|---|---|
| 2005/0186403 A1 | 8/2005 | Seki et al. |
| 2014/0275381 A1 | 9/2014 | Ribi |
| 2015/0171368 A1* | 6/2015 | Vronsky ........... H01L 21/02288 438/7 |
| 2016/0365395 A1 | 12/2016 | Xu et al. |
| 2018/0061722 A1 | 3/2018 | Byun et al. |
| 2018/0102502 A1 | 4/2018 | Kim et al. |
| 2018/0123082 A1* | 5/2018 | Sasaki ................. H01L 51/5246 |
| 2018/0226607 A1 | 8/2018 | Li et al. |

FOREIGN PATENT DOCUMENTS

| | | |
|---|---|---|
| CN | 105355645 A | 2/2016 |
| CN | 105895827 A | 8/2016 |
| CN | 107068908 A | 8/2017 |
| CN | 107331648 A | 11/2017 |
| CN | 107919293 A | 4/2018 |
| WO | 2018001060 A1 | 1/2018 |

OTHER PUBLICATIONS

International Search Report dated Jan. 31, 2019, issued in counterpart Application No. PCT/CN2018/105510 (11 pages).
Office Action dated Feb. 22, 2022, issued in counterpart EP Application No. 18852757.6, with the Extended European Search Report dated Feb. 4, 2022. (28 pages).

* cited by examiner

ORGANIC FILM STRUCTURE AND PREPARATION METHOD THEREOF, ENCAPSULATION STRUCTURE AND PREPARATION METHOD THEREOF, AND LIGHT-EMITTING SUBSTRATE

CROSS-REFERENCE TO RELATED APPLICATIONS

This application claims benefit of the filing date of Chinese Patent Application No. 201810450058.4 filed on May 11, 2018, the disclosure of which is hereby incorporated in its entirety by reference.

TECHNICAL FIELD

The present disclosure relates to display technology, and particularly to an organic film structure, a method for preparing the organic film structure, an encapsulation structure, a method for preparing the encapsulation structure, and a light-emitting substrate.

BACKGROUND

In a new generation of display apparatus, light-emitting apparatus such as Organic Light Emitting Diodes (OLEDs) and Quantum Dots Light Emitting Diodes (QLEDs) are easily eroded by water and oxygen. Thus, a thin film encapsulation (TFE) process is generally performed to isolate the luminescent materials from the water and oxygen. The thin film encapsulation process generally includes forming a first inorganic encapsulation film on a large area including a display area; forming an organic encapsulation film wherein the organic encapsulation film completely covers the display area; and forming a second inorganic encapsulation film. The upper and lower inorganic encapsulation films achieve a function of insulating the luminescent material from water and oxygen. The intermediate organic encapsulation film has no ability to block water and oxygen, but provides flexibility and covers impurity particles on the surface of the first inorganic film, thereby providing a flat surface for the second inorganic film and facilitating release of stresses of the two inorganic encapsulation films.

In the actual production, it is difficult to control colorless liquid organic material used for forming the organic film due to its tendency of overflow. The liquid organic material tends to overflow to form an excessively large organic film, and accordingly, the second inorganic film cannot completely cover the organic film. Thus, the water and oxygen can directly enter the light-emitting apparatus through the organic film. As a result, the second inorganic film is not effective in blocking water and oxygen, thereby decreasing performance of the light-emitting apparatus and shortening the life span of the apparatus.

At present, the method for detecting whether the organic material overflows is to observe the boundary of the organic material with an optical microscope, or to perform a slice observation with a scanning electron microscope. Therefore, the following problems are likely to occur: it is very difficult to observe the colorless organic material, thereby costing extra time and labor. Furthermore, it requires preparing extra samples for the detection, thereby wasting a large amount of material. Furthermore, the feedback speed of the detection results is slow so that the production department cannot adjust the production parameters in time, thereby increasing the production loss.

BRIEF SUMMARY

An embodiment of the present disclosure provides a method for preparing an organic film structure. The method for preparing an organic film structure may include forming a pigment mixture layer outside a region where an organic film is to be formed using a pigment liquid mixture, forming a liquid organic layer in the region where the organic film is to be formed with a first liquid organic material, and curing the pigment mixture layer and the liquid organic layer to form an indicator film and the organic film, respectively. The pigment liquid mixture may include a pigment.

The pigment liquid mixture may further include a second liquid organic material.

Forming the pigment mixture layer outside the region where the organic film is to be formed using the pigment liquid mixture may include forming the pigment mixture layer by an inkjet printing process. The second liquid organic material may be a colorless, transparent liquid organic material. In one embodiment, the second liquid organic material is the same as the first liquid organic material.

The pigment in the pigment liquid mixture may have a color of red, green, or blue.

Curing the pigment mixture layer and the liquid organic layer to form the indicator film and the organic film respectively may be performed by ultraviolet light irradiation. In one embodiment, the indicator film is partially cured. The indicator film may be in a form of a closed annular structure or spaced segments of an annular structure.

A first barrier dam may be further provided outside the region where the organic film is to be formed, and the indicator film may be located outside the first barrier dam. A second barrier dam may be further provided outside the first barrier dam, and the indicator film may be disposed between the first barrier dam and the second barrier dam and/or outside the second barrier dam.

Another example of the present disclosure is an organic film structure. The organic film structure may include an organic film comprising a first organic material and an indicator film comprising a second organic material and a pigment. The indicator film may be located outside a region where the organic film is located, and the second organic material may be a colorless, transparent organic material. The first organic material may be the same as the second organic material.

The indicator film may be in a form of a closed annular structure or spaced segments of an annular structure.

The organic film structure may further include a first barrier dam disposed outside the organic film. The indicator film may be located at a side of the first barrier dam opposite from the organic film.

A second barrier dam may be further disposed at a side of the first barrier dam opposite from the organic film, and the indicator film may be disposed between the first barrier dam and the second barrier dam and/or outside the second barrier dam.

A height of the second barrier dam may be greater than a height of the first barrier dam.

Another example of the present disclosure is an encapsulation structure for encapsulating a light emitting apparatus. The encapsulation structure may include the organic film structure according to one embodiment of the present disclosure. The encapsulation structure may further include a first inorganic film under the organic film and a second inorganic film above the organic film. The second inorganic film completely covers the organic film.

Another example of the present disclosure is a light-emitting substrate comprising a plurality of light-emitting apparatuses, wherein each of the plurality of the light-emitting apparatuses may be encapsulated in the encapsulation structure according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
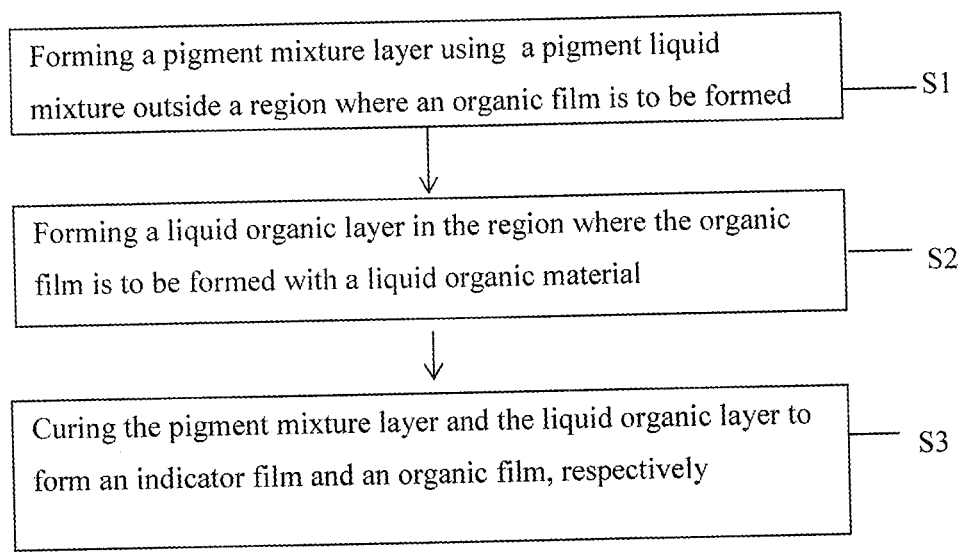
FIG. 1 is a flow chart showing a method of preparing an organic film structure according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-6c. When referring to the figures, like structures and elements shown throughout are indicated with like reference numerals.

Embodiment 1

In the process of forming an organic film structure, the organic material may tend to overflow due to leveling, thereby causing defects in the organic film. One embodiment of the present disclosure provides a process for preparing the organic film structure and the organic film structure obtained thereof. In the process of forming the organic film structure according to one embodiment of the present disclosure, whether the organic material overflows is detected in real time, thereby improving the yield of the organic film structure.

As shown in FIG. 1, the process of forming the organic film structure according to one embodiment of the present disclosure includes the following steps:

In step S1), a pigment mixture layer is formed with a pigment liquid mixture outside the region where an organic film is to be formed.

In this step, the pigment liquid mixture is first formed. The pigmented liquid mixture is used to form an indicator film. The material for forming the organic film is a colorless, transparent liquid organic material to ensure visible light transmittance. Thus, in the preparation of the indicator film, the pigment mixture layer includes a second liquid organic material and a pigment. In one embodiment, the pigment liquid mixture is a mixture of a pigment and a colorless, transparent liquid organic material, that is, the second liquid organic material. The pigments therein preferably have bright and easily distinguishable colors. The pigment in the pigment liquid mixture can have any color that can be clearly observed such as red, green, blue, etc. The red pigment can be a liquid organic pigment such as 3138 toluidine red pigment. Of course, a red inorganic pigment powder such as ferric oxide can also be used as the red pigment. In order to ensure that the pigment liquid mixture can still be cured, it is preferred that the amount of the organic pigment added is not too large. A minimum amount of pigment that can display color is preferably added.

In one embodiment, the pigment liquid mixture is formed into the pigment mixture layer by an inkjet printing process. In view of the preparation process for the indicator film, since the diameters of nozzles responsible for spraying the pigment liquid mixture is generally very small in order to meet the picoliter (pL) level control standard of the inkjet printing process, the pigment particles in the pigment liquid mixture are likely to clog the nozzles. Therefore, when an inorganic pigment is used, the pigment particles are preferably ground to a sufficiently small size and uniformly mixed with the liquid organic material by stirring. The pigment liquid mixture can then be accurately printed to areas outside a barrier dam by the inkjet printing technique to avoid damage to the inkjet printing system.

In order to prevent flowing of the pigment liquid mixture from influencing the subsequent determination, the viscosity of the second liquid organic material in the pigment liquid mixture can be increased to reduce the fluidity thereof. Preferably, the viscosity of the pigment liquid mixture is greater than the viscosity of the second liquid organic material. That is, the second liquid organic material used in the pigment liquid mixture has high viscosity and does not flow freely so that the structure and morphology of the pigment mixture layer in an uncured state is stable enough to form an indicator film having a preset structure. At the same time, the viscosity of the second liquid organic material forming the indicator film is made larger than the viscosity of the liquid organic material for encapsulation so that it is convenient to observe the change of the colored pattern of the indicator film. However, if the second liquid organic material is too viscous, the nozzles tend to be clogged by the second liquid organic material.

In order to better indicate the shape of the organic film, it is preferable that the pigment mixture layer is formed outside the area of the organic film based on the structure of the organic film to be formed. In one embodiment, the indicator film is formed into a closed annular structure, or spaced, segmented annular stricture. Since the pigmented mixture layer is disposed outside the organic film, undesirable overflow of the first organic material can be detected in time during preparation of the organic film.

In step S2, a liquid organic layer is formed in the region where the organic film is to be formed with a first liquid organic material.

In this step, in one embodiment, the first liquid organic material is a colorless, transparent liquid organic material to ensure excellent light transmittance.

In one embodiment, the second liquid organic material for forming the indicator film is the same as the first liquid organic material for forming the organic film.

In step S3, the pigment liquid layer and the liquid organic layer are cured to form the indicator film and the organic film, respectively.

In one embodiment, in this step, the pigment liquid layer and the liquid organic layer are preferably cured by ultraviolet light irradiation. Thus, for the pigment liquid layer and the liquid organic layer composed of an organic material, their structures are set by curing.

Figure 2:
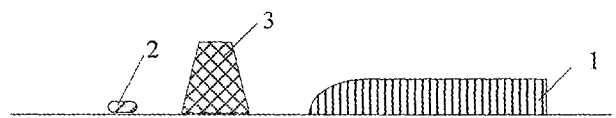
FIG. 2 is a schematic cross-sectional view of an organic film structure according to one embodiment of the present disclosure.

In one embodiment, in order to further define the formation position of the organic film, it is preferable that, as shown in FIG. 2, a first barrier dam 3 is pre-formed outside the region where the organic film 1 is to be formed. The indicator film 2 is located outside the first barrier dam 3. Under the action of the barrier dam, undesirable overflow of the first organic material can be effectively prevented.

In one embodiment, a second barrier dam is further formed outside the first barrier dam 3, and the indicator film 2 is disposed between the first barrier dam 3 and the second barrier dam and/or outside the second barrier dam. In one embodiment, the height of the second barrier dam is greater than the height of the first barrier dam 3. By using a plurality of barrier dams at different positions, the overflow of the first organic material can be blocked and prevented several times.

Another embodiment of the present disclosure further provides an organic film structure. The organic film structure includes an organic film and an indicator film. As shown in FIG. 2, the indicator film 2 is provided outside the organic film 1. The indicator film includes a same organic material as the organic film 1 and a pigment.

In one embodiment, the organic film 1 is made of a first liquid organic material, which is a colorless and transparent organic material. The pigment liquid mixture for forming the indicator film 2 is made of a mixture of a pigment and a second liquid organic material, which is also a colorless, transparent organic material. By matching properties of the material of the indicator film 2 with those of the organic film 1, whether or not the first organic material overflows during the preparation process of the organic film 1 can be monitored in real time.

In one embodiment, the indicator film 2 has a closed annular structure or spaced, segmented annular structure. Since the indicator film 2 is disposed outside the organic film 1, undesirable overflow during the preparation process of the organic film 1 can be observed in time.

In one embodiment, in order to further define the formation position of the organic film 1, it is preferable that, as shown in FIG. 2, a first barrier dam 3 is pre-formed outside the region where the organic film 1 is to be formed, and the indicator film 2 is located outside the first barrier dam 3, that is, at a side of the first barrier dam 3 opposite from the organic film 1. Under the action of the barrier dam, the overflow of the first liquid organic material can be effectively prevented.

In one embodiment, a second barrier dam is pre-formed outside the first barrier dam 3, that is, at a side of the first barrier dam 3 opposite from the organic film. The indicator film 2 is disposed between the first barrier dam 3 and the second barrier dam and/or outside the second barrier dam. The height of the second barrier dam is greater than the height of the first barrier dam 3. By using a plurality of barrier dams at different positions, the overflow of the first liquid organic material can be blocked and prevented several times.

The embodiments of the present disclosure provide the process for preparing the organic film structure and the corresponding organic film structure obtained thereof. a pigment liquid mixture matching the material of the organic film is formed. That is, the liquid organic material for the pigment liquid mixture has a same composition or a compatible composition as the liquid organic material for the organic film. The pigment liquid mixture includes the colorless and transparent liquid organic material and a pigment, and can be fainted into an accurate indicator film by inkjet printing. The indicator film can detect whether the liquid organic material for the organic film overflows in real time.

Embodiment 2

The present embodiment is directed to solve the problem of determining whether a liquid organic material that is colorless and transparent overflows in the preparation process of the encapsulation structure, and provides a encapsulation structure capable of intuitively and conveniently detecting whether the liquid organic material overflows.

The embodiment provides an encapsulation structure for encapsulating a light-emitting apparatus. The encapsulation structure includes the organic film structure in Embodiment 1. The encapsulation structure further includes a first inorganic film under the organic film and a second inorganic film above the organic film. The second inorganic film completely covers the organic film.

Figure 3:
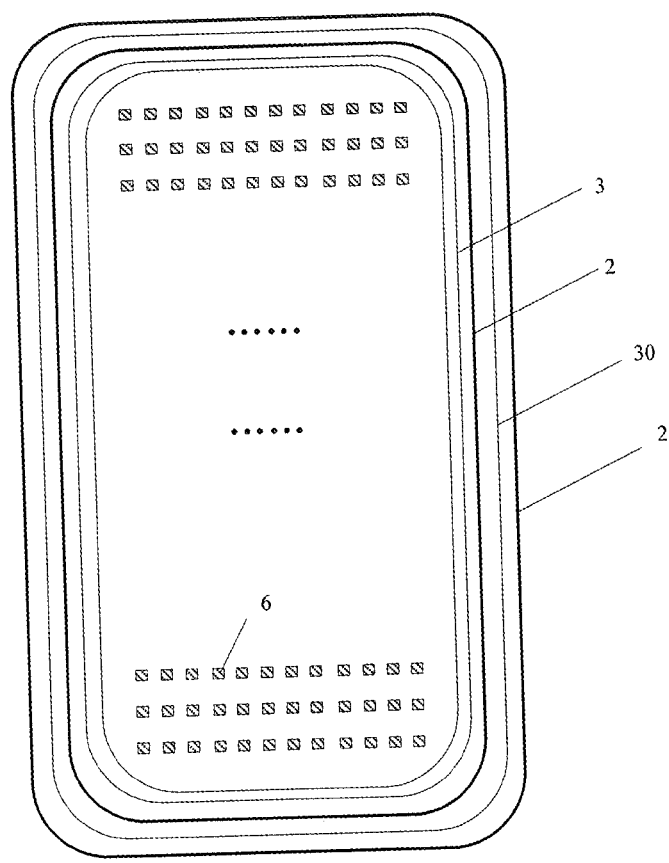
FIG. 3 is a schematic plan view of an encapsulation structure according to one embodiment of the present disclosure.
Figure 4:
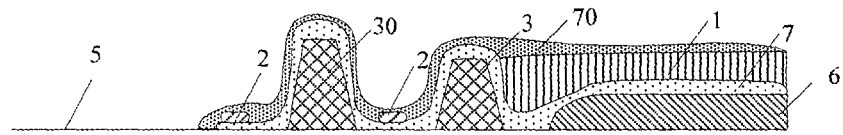
FIG. 4 is a partial cross-sectional view of an encapsulation structure according to one embodiment of the present disclosure.

The encapsulation structure is used for encapsulating the light-emitting apparatus. As shown in FIG. 3 and FIG. 4, the first inorganic film 7, the organic film 1, and the second inorganic film 70 are sequentially stacked. Furthermore, the encapsulation structure further includes a barrier dam correspondingly disposed outside the light-emitting apparatus 6 and an indicator film 2 disposed outside the barrier dam. The light-emitting apparatus 6 is disposed in the display area. The barrier dam is used to block the overflow of the liquid organic material, and the indicator film 2 is used to indicate whether the liquid organic material overflows.

The method for preparing the encapsulation structure includes the method for preparing the organic film 1 in embodiment 1. The preparation process of the organic film 1 in Embodiment 1 is applied to the formation process of the encapsulation structure, so that the indicator film 2 detects whether or not the organic material overflows undesirably. As such, the organic film 1 is ensured to be completely covered by the second inorganic film 70.

In one embodiment, the process for preparing the encapsulation structure includes the following steps:

In step S11, a first inorganic film is formed. The first inorganic film covers a region including the display region and the barrier dam.

Figure 5A:
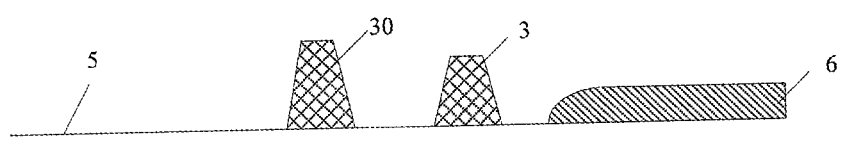
FIGS. 5A-5F are flowcharts of a process of preparing an encapsulation structure according to one embodiment of the present disclosure.

The first inorganic film 7 is formed on a substrate 5 as shown in FIG. 5A. The substrate 5 may be a glass substrate or an engineering plastic substrate such as polyimide.

Figure 5B:
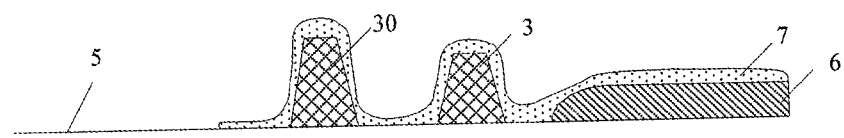

In one embodiment, a barrier dam is pre-formed on the substrate 5 carrying the light-emitting apparatus 6. In one embodiment, a barrier dam is formed in advance in the non-display area of the substrate 5, and the substrate can then be directly used to prepare the encapsulation structure. The light-emitting apparatus 6 may include an organic light-emitting diode apparatus or a quantum dot light-emitting diode, and is usually formed in an effective display area, which is also referred to as an Active Area or an AA area. The barrier dam serves to block overflow of the liquid organic material. In one embodiment, the substrate 5 including a first barrier dam 3 and a second barrier dam 30 is described in detail below as an example:

In one embodiment, as shown in FIG. 5B, in this step, the first inorganic film 7 is formed over the light-emitting apparatus 6, the first barrier dam 3, and the second barrier dam 30. The first inorganic film 7 is made of silicon nitride or silicon oxynitride. The first inorganic film 7 is in close contact with the surface of the light-emitting apparatus 6, and has a thickness of about 1 µm. The first inorganic film 7 has a large area and it includes a display area and a barrier dam outside the display area.

In step S12, an indicator film is formed. The indicator film is located outside the barrier dam and above the first inorganic film.

A preferred embodiment of forming the indicator film 2 may be that, in the encapsulation structure surrounding the first barrier dam 3 and the second barrier dam 30 outside the light-emitting apparatus 6, an indicator film 2 is formed in a regular pattern outside the first barrier dam 3 or an indicator film 2 is formed in a regular pattern between the first barrier dam 3 and the second barrier dam 30.

The indicator film 2 can be set according to actual needs. If there is a plurality of rounds of barrier dams and the indicator film 2 is not sensitive to slight overflow of the liquid organic material for encapsulation, the indicator film 2 can be disposed only outside the outermost round of the second barrier dam 30. If there is a plurality of rounds of barrier dams or a single round of barrier dam, and it is necessary to detect the overflow of liquid organic materials used for encapsulation in each area, the indicator film 2 can be disposed outside each round of barrier dam. The indicator film 2 may be in a form of a closed annular ring or segments of an annular ring, which may be set according to actual needs.

Figure 5C:
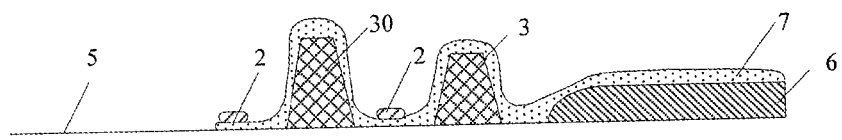

In one embodiment, as shown in FIG. 5C, in this step, the indicator film 2 is provided above the first inorganic film 7 in a region outside of the barrier dam. In order to ensure visible light transmittance, the material used to form the organic film 1 in the encapsulation structure is a colorless, transparent liquid organic material. Therefore, in the preparation of the indicator film 2, a liquid organic material having the same composition as the liquid organic material forming the organic film for encapsulation can be used. The organic pigment can be thoroughly mixed with the colorless, transparent liquid organic material.

In the display apparatus, the light-emitting apparatus 6 set as one pixel structure emits different colors and realizes full-color display. The indicator film 2 preferably adopts a color that can be clearly distinguishable. For example, red, green, blue (RGB) color or the like can be used. During this process, the light-emitting apparatus is not illuminated, and the color of the RGB is not displayed under the optical inspection machine. Therefore, the indicator film can have a color which is used to achieve full color display by the light-emitting apparatus. In one embodiment, for example, the red pigment may be a liquid organic pigment such as 3138 toluidine red. Of course, the pigment may also be red inorganic pigment powders such as ferric oxide. In order to ensure that the pigment liquid mixture after mixing can still be cured, it is preferred that the amount of the organic pigment added is not too large. A minimum amount of pigment that can display color is preferably added.

In view of the preparation process of the indicator film 2, since the diameters of the nozzles responsible for spraying the pigment liquid mixture are generally very small in order to meet the picoliter (pL) level control standard of the inkjet printing process, the pigment powders are likely to clog the nozzles. Therefore, when the inorganic pigment powders are used, the pigment powders are preferably ground to sufficiently small size and uniformly mixed with the liquid organic material by stirring. The pigmented liquid mixture can then be accurately printed to the area outside the barrier dam by the inkjet printing technology to to avoid damage to the inkjet printing system.

In order to prevent the flow of the pigment liquid mixture from influencing the subsequent determination, the viscosity of the second liquid organic material in the pigment liquid mixture can be increased to reduce the fluidity thereof. Preferably, the viscosity of the pigment liquid mixture is greater than the viscosity of the second liquid organic material. As such, the second liquid organic material used in the pigment liquid mixture has high viscosity and does not flow freely so that the structure and morphology of the pigment mixture layer in an uncured state is stable enough to form an indicator film having a preset structure. At the same time, the viscosity of the second liquid organic material forming the indicator film is made larger than the viscosity of the first liquid organic material for encapsulation so that it is convenient to observe the change of the regular colored pattern of the indicator film. However, if the second liquid organic material is too viscous, the nozzles tend to be clogged by the second liquid organic material.

In step S13, an organic film is formed. The organic film is located above the first inorganic film. The organic film completely covers the display area and partially extends to the non-display area.

Figure 5D:
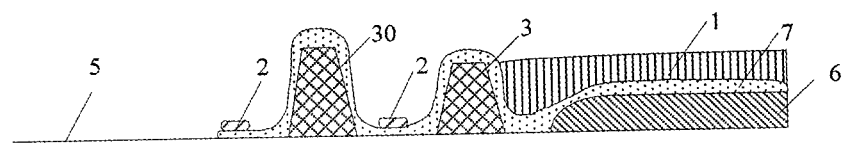

As shown in FIG. 5D, in this step, the organic film 1 is provided on the first inorganic film 7 in a region corresponding to the display region. The first liquid organic material is sprayed onto the surface of display region of the apparatus by an inkjet printing process, and the first liquid organic material is allowed to be free flowing (leveling) over a period of time. The organic film 1, that is, the organic encapsulation layer, has a thickness of about 4 µm to about 10 µm, and the encapsulation requirement for the organic film 1 is to completely cover the display region, but not to pass over the barrier dam.

In step S14), the indicator film and the organic film are cured.

Figure 5E:
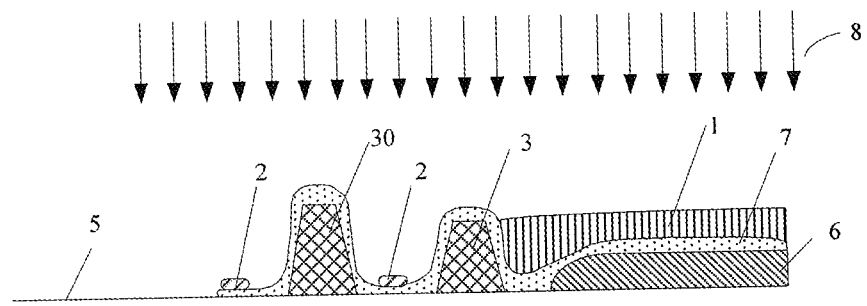

In one embodiment, as shown in FIG. 5E, in this step, it is preferable to irradiate the film by ultraviolet light 8. During the curing process, the indicator film 2 and the organic film 1 are irradiated with ultraviolet light 8 of sufficient light intensity and energy to cure all the liquid organic materials and the pigmented liquid mixture.

In one embodiment, the indicator film is partially cured.

In one embodiment, curing can also be performed by thermal curing. However, the thermal curing tends to cause the temperature of the apparatus to be changed frequently. As such, the stress becomes large after thermal expansion and contraction of the film layer, which is disadvantageous for ensuring stability of the encapsulation layer.

In step S15, a second inorganic film is formed. The second inorganic film is located on the organic film, and completely covers the first inorganic film.

Figure 5F:
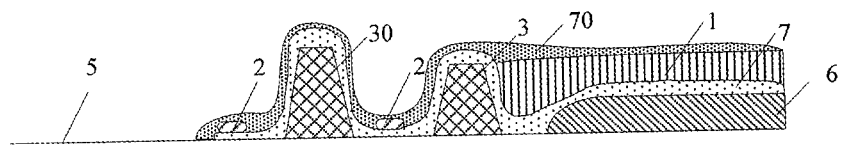

As shown in FIG. 5F, in this step, a second inorganic film 70 is formed over the organic film 1.

At this point, the encapsulation structure is completed.

The method for preparing the encapsulation structure according to one embodiment of the present disclosure is interspersed with the structures of the organic film and the indicator film separately prepared in Embodiment 1, thereby forming a high-yield encapsulation structure.

Figure 6A:
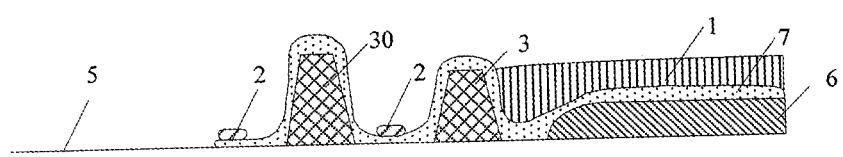
FIGS. 6A-6C are schematic diagrams of edge of an organic film in an encapsulation structure under different situation according to one embodiment of the present disclosure.

In one embodiment, the following is a description of the different conditions when the first liquid organic material flows freely:

In one embodiment, as shown in FIG. 6A, the first liquid organic material forming the organic film 1 does not overflow, and the first liquid organic material does not come into contact with the incompletely solidified pigment liquid mixture. As such, the regular colored pattern of the indicator film 2 does not change.

Figure 6B:
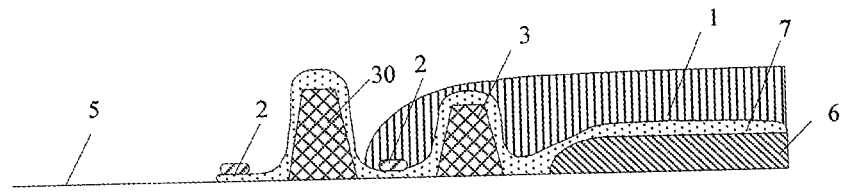
Figure 6C:
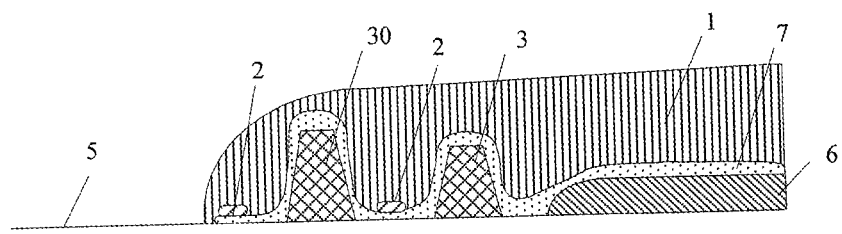

In one embodiment, as shown in FIG. 6B and FIG. 6C, when the first liquid organic material forming the organic film 1 overflows over the barrier dam, the first liquid organic material will be in contact with the incompletely cured pigment liquid mixture. Due to the composition of the liquid organic material used for the preparation of indicator film 2 and the liquid organic material for encapsulation is identical except the difference in viscosity, based on the like dissolves like principle, the indicator film 2 and the overflowed first liquid organic material undergoes physical reaction such as dissolving into each other, and the pigment in the indicator film 2 having a large color concentration will diffuse into the organic material for encapsulation. For example, the toluidine red in the pigment liquid mixture will diffuse into the overflowed colorless, liquid organic material. As such, the regular colored pattern of the indicator film 2 is destroyed, so that the original regular colored pattern of the indicator film 2 becomes no longer regular. That is, the color is not in the original position because of the diffusion. The colored pattern is no longer uniform and becomes no longer regular compared with colors in the original position. Through this change, the tester can easily determine whether the organic material overflows.

At present, whether the first liquid organic material for encapsulation overflows is detected by an optical inspection machine or a scanning electron microscope to detect the position where the first liquid organic material stops. The overflow detection method adopted by the encapsulation structure and its corresponding preparation method in above embodiments of the present disclosure saves a lot of manpower and material resources, and easily and quickly detect whether the liquid organic material overflows. The feedback of the detection result is fast, which can help the production department to quickly adjust the process parameters, thereby reducing production loss and improving yield.

Embodiment 3

One embodiment of the present disclosure provides a light-emitting substrate, which comprises a plurality of light-emitting apparatus. The light-emitting apparatus is encapsulated by the encapsulation structure of Embodiment 2.

The light-emitting substrate can be used for preparing any product or component with display function, such as desktop computer, tablet computer, notebook computer, mobile phone, PDA, GPS, vehicle display, projection display, camera, digital camera, electronic watch, calculator, electronic instrument, meter, liquid crystal panel, electronic paper, TV, monitor, digital photo frame, navigator, etc., which can be applied to many fields such as public display and virtual display.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

DESCRIPTION OF SYMBOLS IN THE DRAWINGS

1—organic film; 2—indicator film; 3—first barrier dam; 30—second barrier dam; 5—substrate; 6—light-emitting apparatus; 7—first inorganic film; 70—second inorganic film; 8—UV light.

What is claimed is:

1. A method for preparing an organic film structure, comprising:
   forming a pigment mixture layer outside a region where an organic film is to be formed using a pigment liquid mixture;
   forming a liquid organic layer in the region where the organic film is to be formed with a first liquid organic material; and
   curing the pigment mixture layer and the liquid organic layer to form an indicator film and the organic film, respectively;
   wherein the pigment liquid mixture comprises a pigment, a first barrier dam is further provided outside the region where the organic film is to be formed, and the indicator film is located outside the first barrier dam.

2. The preparation method according to claim 1, wherein the pigment liquid mixture further comprises a second liquid organic material.

3. The preparation method according to claim 1, wherein forming the pigment mixture layer outside the region where the organic film is to be formed using the pigment liquid mixture comprises:
   forming the pigment mixture layer by an inkjet printing process.

4. The preparation method according to claim 2, wherein the second liquid organic material is a colorless, transparent liquid organic material.

5. The preparation method according to claim 4, wherein the second liquid organic material is the same as the first liquid organic material.

6. The preparation method according to claim 4, wherein the pigment in the pigment liquid mixture has a color of red, green, or blue.

7. The preparation method according to claim 1, wherein curing the pigment mixture layer and the liquid organic layer to form the indicator film and the organic film, respectively is performed by ultraviolet light irradiation.

8. The preparation method according to claim 7, wherein the indicator film is partially cured.

9. The preparation method according to claim 1, wherein the indicator film is in a form of a closed annular structure or spaced segments of an annular structure.

10. The preparation method according to claim 1, wherein a second barrier dam is further provided outside the first barrier dam, and the indicator film is disposed between the first barrier dam and the second barrier dam and/or outside the second barrier dam.

11. An organic film structure, comprising
an organic film comprising a first organic material,
a first barrier dam disposed outside the organic film, and
an indicator film comprising a second organic material and a pigment,
wherein the indicator film is located outside a region where the organic film is located, the indicator film is located at a side of the first barrier dam opposite from the organic film, and the second organic material is a colorless, transparent organic material.

12. The organic film structure according to claim 11, wherein the first organic material is the same as the second organic material.

13. The organic film structure according to claim 11, wherein the indicator film is in a form of a closed annular structure or spaced segments of an annular structure.

14. The organic film structure according to claim 11, wherein a second barrier dam is further disposed at a side of the first barrier dam opposite from the organic film, and the indicator film is disposed between the first barrier dam and the second barrier dam and/or outside the second barrier dam.

15. The organic film structure according to claim 14, wherein a height of the second barrier dam is greater than a height of the first barrier dam.

16. An encapsulation structure for encapsulating a light emitting apparatus, comprising the organic film structure of claim 11.

17. The encapsulation structure according to claim 16, further comprising a first inorganic film under the organic film and a second inorganic film above the organic film, the second inorganic film completely covering the organic film.

18. A light-emitting substrate comprising a plurality of light-emitting apparatuses, wherein each of the plurality of the light-emitting apparatuses is encapsulated in the encapsulation structure according to claim 16.

* * * * *